US009014381B2

(12) United States Patent
Quan et al.

(10) Patent No.: US 9,014,381 B2
(45) Date of Patent: Apr. 21, 2015

(54) SWITCH TECHNIQUES FOR LOAD SENSING

(71) Applicant: QUALCOMM Incorporated, San Diego, CA (US)

(72) Inventors: Xiaohong Quan, San Diego, CA (US); Peter J. Shah, San Diego, CA (US); Ankit Srivastava, San Diego, CA (US); Guoqing Miao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 285 days.

(21) Appl. No.: 13/723,170

(22) Filed: Dec. 20, 2012

(65) Prior Publication Data

US 2014/0177850 A1 Jun. 26, 2014

(51) Int. Cl.

*H03G 11/00* (2006.01)
*H04R 3/00* (2006.01)
*H04R 29/00* (2006.01)

(52) U.S. Cl.

CPC .............. *H04R 3/007* (2013.01); *H04R 29/001* (2013.01)

(58) Field of Classification Search

CPC .................................. H04R 3/007; H03F 1/52
USPC ............................................................ 381/55
See application file for complete search history.

(56) References Cited

U.S. PATENT DOCUMENTS

| | | | |
|---|---|---|---|
| 7,078,964 B2 | 7/2006 | Risbo et al. | |
| 7,321,260 B2 | 1/2008 | Larson | |
| 7,417,503 B2 | 8/2008 | Xu et al. | |
| 7,990,215 B2 | 8/2011 | Soenen et al. | |
| 2006/0250153 A1* | 11/2006 | Colbeck | 324/769 |
| 2012/0002819 A1 | 1/2012 | Thormundsson et al. | |

FOREIGN PATENT DOCUMENTS

| | | |
|---|---|---|
| EP | 2398253 A1 | 12/2011 |
| EP | 2405675 A1 | 1/2012 |

OTHER PUBLICATIONS

Brennan, S., "Measuring a Loudspeaker Impedance Profile Using the AD5933", Application Note Analog Devices, No. AN-843, Jun. 1, 2007, pp. 1-12, XP007908782, the whole document.

International Search Report and Written Opinion—PCT/US2013/076759—ISA/EPO—Apr. 10, 2014.

Mateljan, I., "Arta-Application Note", Apr. 11, 2006, XP055111026, pp. 1-9, Retrieved from the Internet: URL:http://www.artalabs.hr/AppNotes/AP1_MeasuringBox-Rev4Eng.pdf [retrieved on Mar. 31, 2014], the whole document.

* cited by examiner

*Primary Examiner* — Simon King
(74) *Attorney, Agent, or Firm* — James Gutierrez

(57) ABSTRACT

Techniques for sensing the resistance of a load. In an aspect, a sense resistor is provided in series with the load. Each terminal of the sense resistor is alternately coupled via switches to a sense amplifier. A second input of the sense resistor is coupled to a terminal of the load. The voltage drop across the load and the voltage drop across the load plus sense resistor are alternatively measured. These voltage drops may be digitized and used to compute a resistance of the load using, e.g., a digital processor.

20 Claims, 8 Drawing Sheets

SWITCH TECHNIQUES FOR LOAD SENSING

BACKGROUND

1. Field

The invention relates to a scheme for measuring the impedance of a load, e.g., an audio load, coupled to an amplifier.

2. Background

Portable electronic devices such as cellular phones, notebook computers, and/or portable media players commonly incorporate an audio output device, e.g., a miniature speaker. Miniature speakers are typically not very robust, i.e., they can readily fail due to over-heating if driven by excessively large voltages. To prevent such failure, a device incorporating the speakers may also include circuitry for detecting the load impedance, e.g., the resistance of the miniature speaker. Upon detecting the load impedance, the device may take various steps to prevent failure of the load, e.g., by limiting the maximum drive voltage applied to such load, and/or by using the detected impedance directly as an indication of load temperature to determine whether the load should be driven or not.

To detect load impedance, a sense resistor may be coupled in series with the load, and the load impedance may be derived from measurements of the voltage drops across the load and the sense resistor, combined with a priori knowledge of the resistance of the sense resistor. Typically, it is desired to make the sense resistor much smaller than the load to avoid unnecessary power dissipation. Accordingly, the gain characteristics of a first signal path used to process the load voltage drop may be very different from the gain characteristics of a second signal path used to process the sense resistor voltage drop, due to the significantly different voltage swings expected. The large difference between the signal path gains may degrade the accuracy of the load impedance measurement, as it may be difficult to obtain accurate matching between the two signal paths and to minimize relative gain errors.

It would be desirable to provide techniques to improve the accuracy of load impedance measurement given the design constraints of such a system.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term “exemplary” used throughout this description means “serving as an example, instance, or illustration,” and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
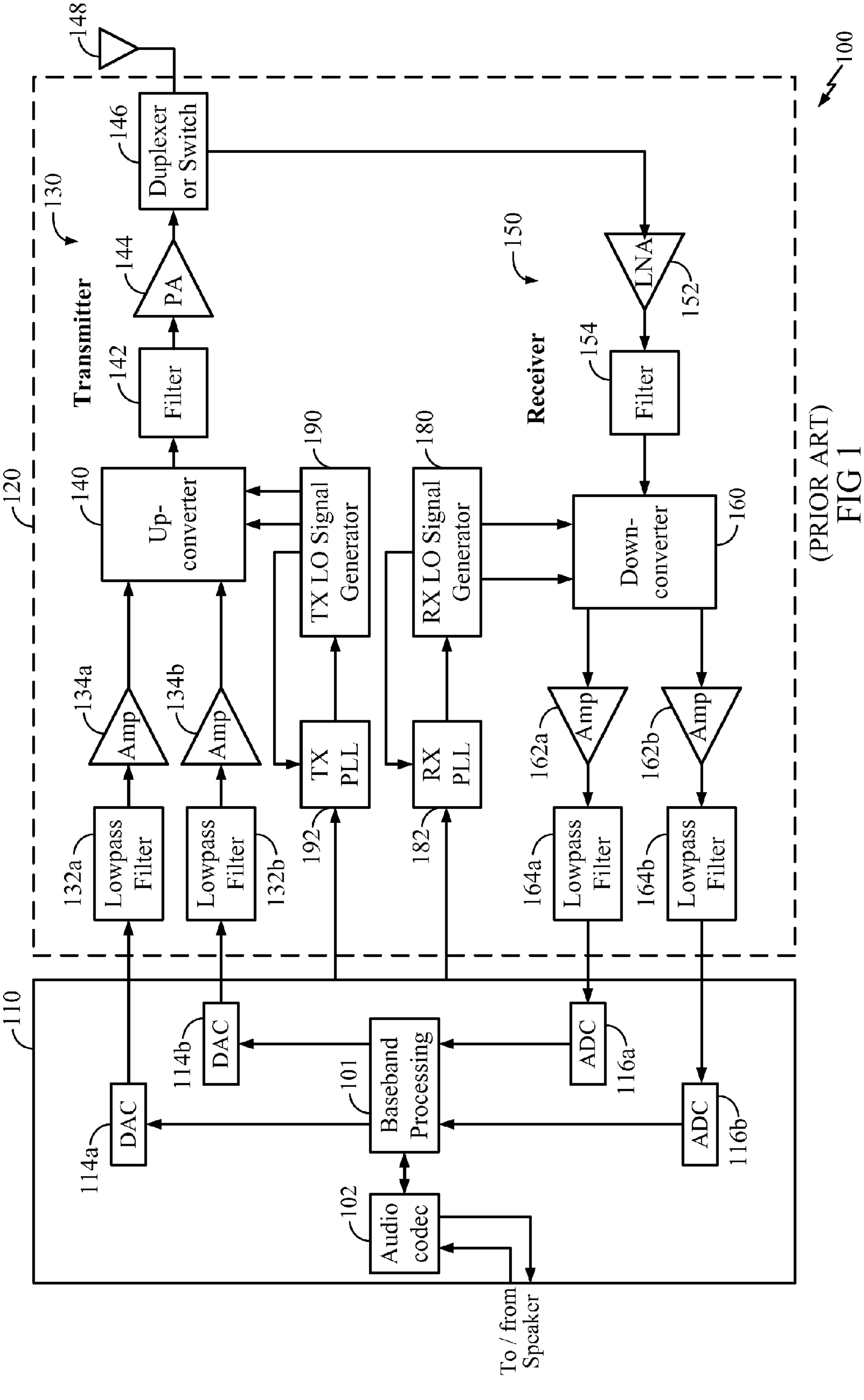
(PRIOR ART) FIG 1
FIG. 1 illustrates a block diagram of wireless communications circuitry in which the techniques of the present disclosure may be implemented.

FIG. 1 illustrates a block diagram of wireless communications circuitry 100 in which the techniques of the present disclosure may be implemented. The circuitry 100 may correspond to, e.g., circuitry implemented in the media device 240 shown in FIG. 2. Note FIG. 1 is provided for illustrative purposes only, and is not meant to restrict the scope of the present disclosure to only wireless communication devices implementing the load sensing techniques disclosed herein. In alternative exemplary embodiments, the techniques disclosed herein may be implemented in an audio or other multimedia system without the radio transmit and receive elements shown in FIG. 1, and such alternative exemplary embodiments are contemplated to be within the scope of the present disclosure.

FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted.

In the design shown in FIG. 1, wireless circuitry 100 includes a transceiver 120 and a data processor 110. The data processor 110 may include a memory (not shown) to store data and program codes. Transceiver 120 includes a transmitter 130 and a receiver 150 that support bi-directional communication. In general, wireless circuitry 100 may include any number of transmitters and any number of receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114*a* and 114*b* for converting digital signals generated by the data processor 110 into I and Q analog output signals, e.g., I and Q output currents, for further processing.

Within transmitter 130, lowpass filters 132*a* and 132*b* filter the I and Q analog output signals, respectively, to remove undesired images caused by the prior digital-to-analog conversion. Amplifiers (Amp) 134*a* and 134*b* amplify the signals from lowpass filters 132*a* and 132*b*, respectively, and provide I and Q baseband signals. An upconverter 140 upconverts the I and Q baseband signals with I and Q transmit (TX) local oscillating (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals (e.g., transmitted by base stations) and provides a received RF signal, which is routed through duplexer or switch 146 and provided to a low noise amplifier (LNA) 152. The received RF signal is amplified by LNA 152 and filtered by a filter 154 to obtain a desirable RF input signal. A downconverter 160 downconverts the RF input signal with I and Q receive (RX) LO signals from an RX LO signal generator 180 and provides I and Q baseband signals. The I and Q baseband signals are amplified by amplifiers 162*a* and 162*b* and further filtered by lowpass filters 164*a* and 164*b* to obtain I and Q analog input signals, which are provided to data processor 110. In the exemplary embodiment shown, the data processor 110 includes analog-to-digital-converters (ADC's) 116*a* and 116*b* for converting the analog input signals into digital signals to be further processed by the data processor 110.

TX LO signal generator 190 generates the I and Q TX LO signals used for frequency upconversion. RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

The data processor 110 further includes a baseband processing module 101 configured to process RX data from the ADC's 116*a*, 116*b*, and further to process TX data to the DAC's 114*a*, 114*b*. The baseband processing module 101 is further coupled to an audio codec 102. The module 101 may transmit digital signals to the audio codec 102 for output as an analog audio signal, and may further receive digital signals from the audio codec 102 corresponding to audio input signals. The audio codec 102 may further interface with audio signals to and from a speaker (not shown in FIG. 1). In an exemplary embodiment, the techniques of the present disclosure may be implemented, e.g., in the data processor 110, or using external circuitry (not shown in FIG. 1) separate from the data processor 110.

Figure 2:
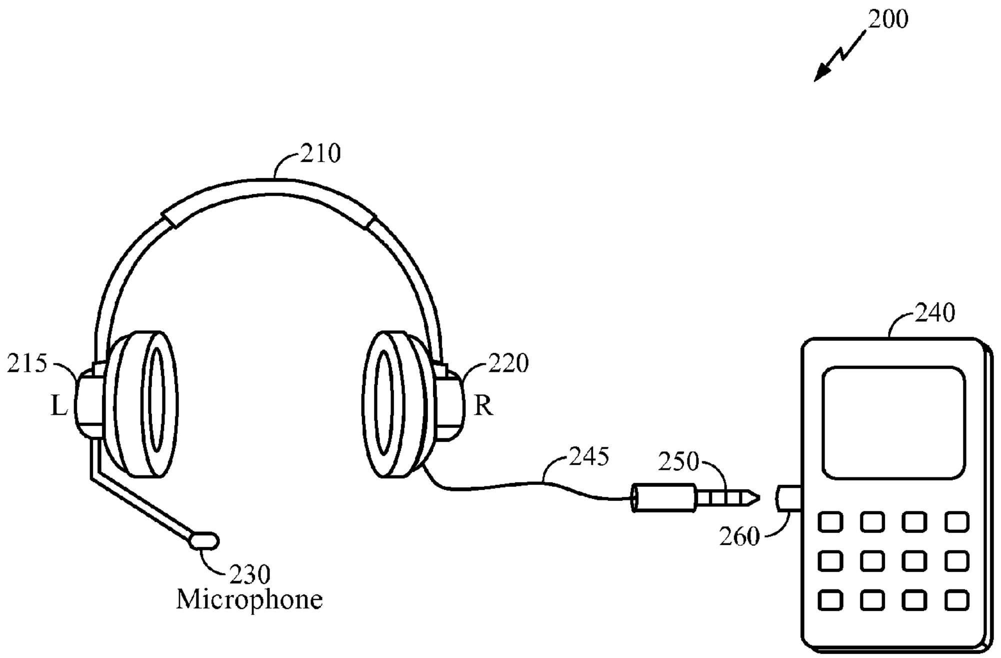
(PRIOR ART) FIG 2
FIG. 2 illustrates an exemplary scenario including a media device wherein the techniques of the present disclosure may be applied.

FIG. 2 illustrates an exemplary scenario 200 including a media device 240 wherein the techniques of the present disclosure may be applied. It will be appreciated that FIG. 2 is shown for illustrative purposes only, and is not meant to limit the scope of the present disclosure to the particular system shown. For example, it will be appreciated that the techniques disclosed herein may also be readily applied to audio devices other than those shown in FIG. 2. Furthermore, the techniques may also be readily adapted to other types of multi-media devices, as well as to non-audio media devices, e.g., supporting loads such as video, etc. Such alternative exemplary embodiments are contemplated to be within the scope of the present disclosure.

In FIG. 2, a headset 210 includes a left (L) headphone 215, a right (R) headphone 220, and a microphone 230. Each of the L and R headphones 215, 220 may include a miniature speaker, whose impedance may be detected using the techniques of the present disclosure. Note while certain exemplary embodiments are described herein wherein a miniature speaker may be found in a headset, it will readily be appreciated that in alternative exemplary embodiments, one or more miniature speakers may also be incorporated directly in the device 240 itself, e.g., for directly generating audio output. Such alternative exemplary embodiments are contemplated to be within the scope of the present disclosure.

The components of the headset 210 are electrically coupled to terminals of a plug 250 via sheathed conducting wires 245. The plug 250 is insertable into a jack 260 of a media device 240. Note the jack 260 need not extrude from the surface of the device 240 as suggested by FIG. 2, and furthermore, the sizes of the elements shown in FIG. 2 are not necessarily drawn to scale. The device 240 may be, for example, a mobile phone, MP3 player, home stereo system, etc.

Audio and/or other signals may be exchanged between the device 240 and the headset 210 through the plug 250 and jack 260. The plug 250 receives the audio signals from the jack 260, and routes the signals to the L and R headphones of the headset 210. The plug 250 may further couple an electrical signal with audio content generated by the microphone 230 to the jack 260, and the microphone signal may be further processed by the device 240. Note the plug 250 may include further terminals not shown, e.g., for communicating other types of signals such as control signals, video signals, etc.

Figure 3:
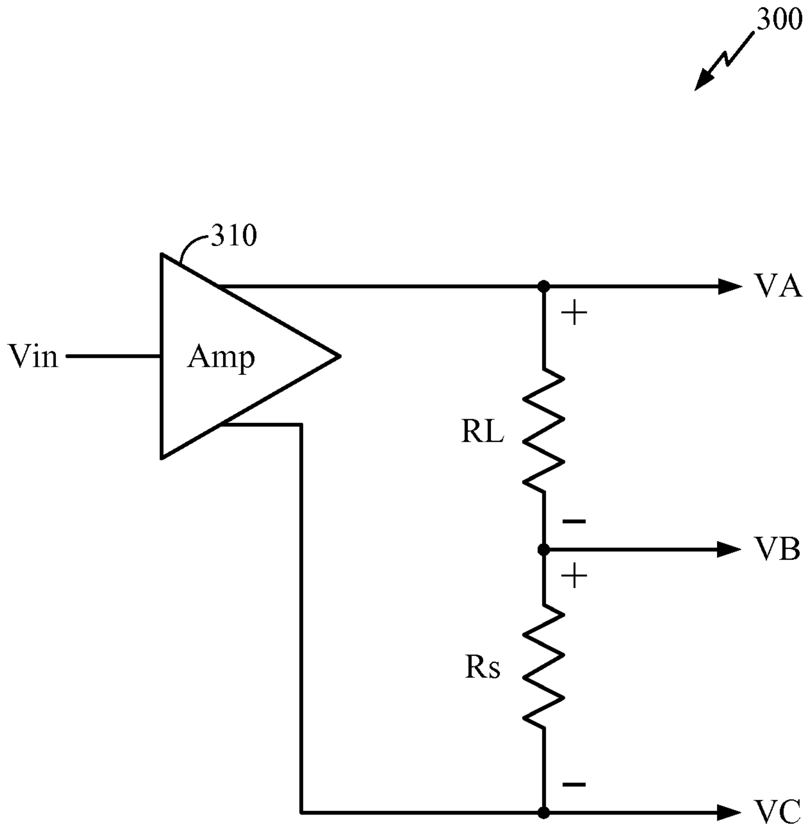
(PRIOR ART) FIG 3
FIG. 3 shows a prior art implementation of a scheme for sensing the resistance of a speaker.

It will be appreciated that miniature speakers in portable electronics, e.g., such as found in the left and right headphones 215, 220, may not be very robust, and can easily fail due to, e.g., over-heating. To prevent such over-heating, certain prior art techniques are available to estimate the temperature of the speaker. FIG. 3 shows a prior art implementation of a scheme 300 for sensing the resistance of a speaker. In FIG. 3, an audio amplifier 310 drives a speaker represented as a load resistance RL. Voltage VA is present at a first terminal of RL, and voltage VB is present at a second terminal of RL. In general, the value of the resistance RL is not known a priori, and it would be desirable to sense the value of such resistance, which may be related to the temperature, according to techniques such as described hereinbelow.

In an implementation, a sense resistor Rs may be placed in series with the speaker RL. Voltage VB is present at a first terminal of Rs, and voltage VC is present at a second terminal of Rs. Note in this scheme, the resistance of Rs is known a priori. Given this configuration, to determine the value of the resistance of RL, the voltages VA, VB, and VC may be measured. As Rs is known, the value of current through Rs, and, correspondingly, the current through RL may be computed, and the value of RL may thus be estimated from knowledge of the current through RL and the voltage across RL (i.e., VA−VB).

Figure 4:
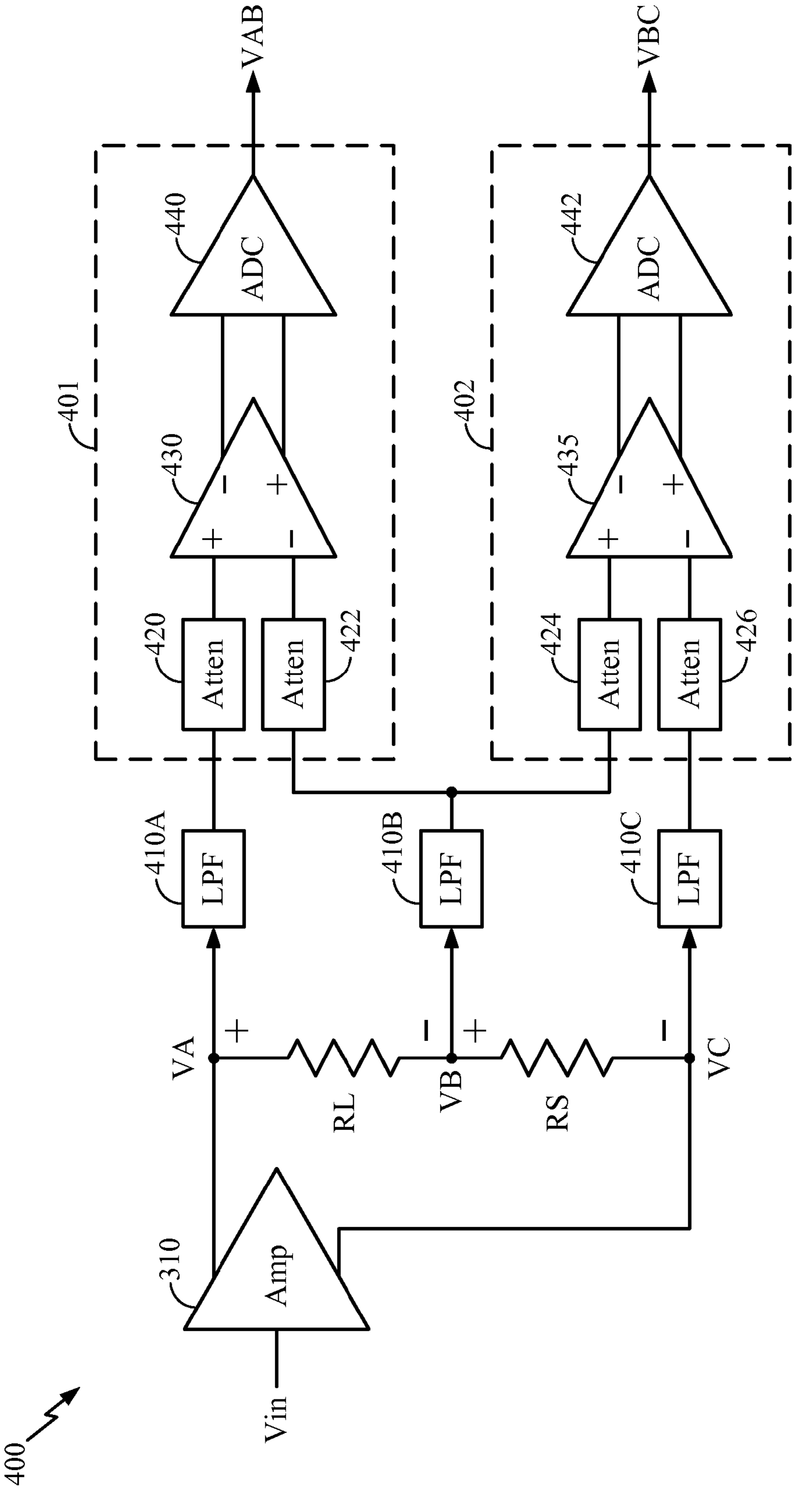
FIG. 4 illustrates an implementation of circuitry for performing certain functions described hereinabove.

FIG. 4 illustrates an implementation of circuitry for performing certain functions described hereinabove. Note FIG. 4 is shown for illustrative purposes only, and is not meant to limit the scope of the present disclosure in any manner.

In FIG. 4, low-pass filters (LPF's) 410A, 410B, and 410C are provided to filter the voltages VA, VB, and VC, respectively. The outputs of LPF's 410A and 410B are coupled to a first sense path 401, and the outputs of LPF's 410B and 410C are coupled to a second sense path 402. Attenuation elements 420, 422, 424, 426 are provided in the first and second sense paths 401, 402 to attenuate the filtered, sensed voltages. The outputs of attenuation elements 420, 422 in the first sense path 401 are provided to a differential amplifier 430, whose differential outputs are digitized by an analog-to-digital converter 440 to generate a first digital output signal VAB. Similarly, the outputs of attenuation elements 424, 426 in the second sense path 402 are provided to a differential amplifier 435, whose differential outputs are digitized by an analog-to-digital converter 442 to generate a second digital output signal VBC. In an exemplary embodiment, the digital output signals VAB, VBC may be utilized, along with knowledge of the resistance Rs, to compute the resistance RL using, e.g., a digital processor (not shown in FIG. 4), as follows (Equation 1):

$$RL = \frac{VAB}{(VBC/Rs)}.$$

It will be appreciated that the overall gain provided by attenuation elements 420, 422, and amplifier 430 of the first sense path 401 may generally be chosen such that the expected value of VA−VB falls within the input dynamic range of the ADC 440, and similarly for the attenuation elements 424, 424, and amplifier 435 of the second sense path 402 and ADC 442. However, as the sense resistance Rs may generally be much smaller than the speaker resistance RL, e.g., due to the desire to minimize Rs to avoid unnecessary power dissipation, the overall gains provided by first sense path 401 and second sense path 402 may be significantly different from each other. Furthermore, the matching between the differential elements of each of sense paths 401 and 402 (e.g., between attenuation elements 420 and 422, etc.) may affect the accuracy of the overall measurements. Accordingly, for the implementation 400, it becomes critical and challenging to minimize the gain error mismatch between the first and second sense paths 401, 402, as well as gain error mismatch between differential elements of each of the sense paths 401, 402.

Figure 5:
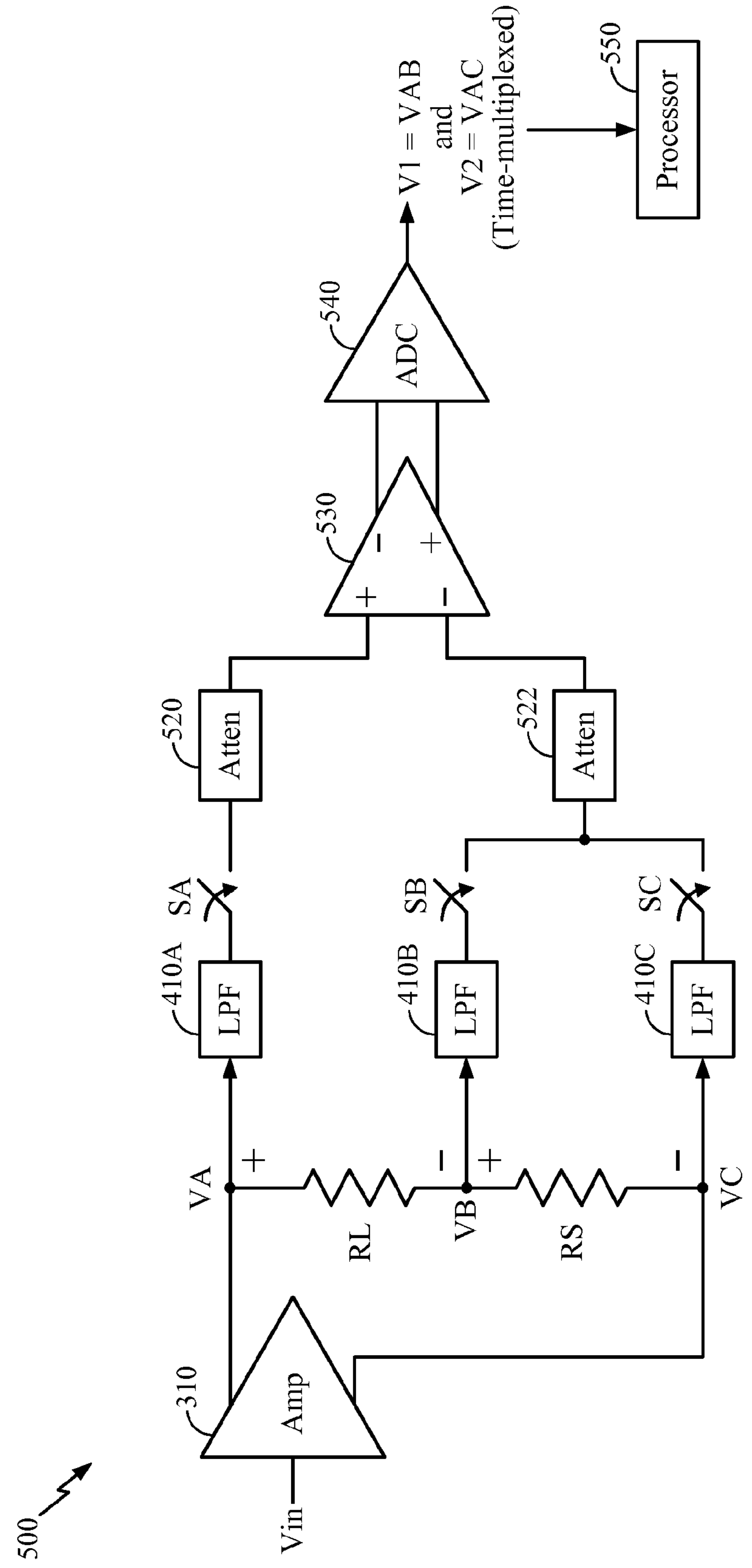
FIG. 5 illustrates an exemplary embodiment of circuitry for sensing load impedance according to the present disclosure.

FIG. 5 illustrates an exemplary embodiment 500 of circuitry for sensing load impedance according to the present disclosure. Note FIG. 5 is shown for illustrative purposes only, and is not meant to limit the scope of the present disclosure to exemplary embodiments incorporating all of the elements shown. Note similarly labeled elements in FIGS. 4 and 5 may perform similar functions, unless otherwise noted.

In FIG. 5, the outputs of LPF's 410A, 410B, 410C are coupled to switches SA, SB, SC, respectively. Switch SA (also denoted herein as a "third switch") selectively couples LPF 410A to an attenuation element 520. In an exemplary embodiment, SA may be closed whenever the voltages VA, VB, VC are to be measured and sampled. Switches SB and SC (also denoted herein as a "first switch" and a "second switch," respectively) selectively couple the output of one of LPF's 410B and 410C to a single attenuation element 522. In an exemplary embodiment, the switches SB and SC are configured such that at most one of LPF's 410B and 410C is coupled to the attenuation element 522 at any time. It will be appreciated that SB and SC may be designed to accommodate rail-to-rail voltages, according to circuit design principles known to one of ordinary skill in the art.

As noted, SA may always be closed when load impedance is to be measured, and thus may also be denoted herein as a "dummy switch." It will be appreciated that the characteristics of SA may nevertheless be chosen to provide good matching between the characteristics of the signal path corresponding to SA and the characteristics of the signal path corresponding to SB or SC. For example, in an exemplary embodiment, the size of and/or gate overdrive voltage applied to SA (e.g., assuming SA is implemented as a transistor switch) may match the size of and/or gate overdrive voltage applied to SB and SC.

The outputs of attenuation elements 520, 522 are coupled to the inputs of a differential amplifier 530 (or "sense amplifier"). In particular, the output of 522 is coupled to a "first terminal" of the sense amplifier 530, while the output of 520 is coupled to a "second terminal" of the sense amplifier 530. The sense amplifier 530 generates a differential output for the ADC 540. The ADC 540 successively generates at least two output voltages over time, i.e., a first output V1=VAB (corresponding to when SB is closed and SC is open) and a second output V2=VAC (corresponding to when SC is closed and SB is open). In this manner, the measured voltages V1 and V2 may be considered to be multiplexed in time at the output of ADC 540. Further shown in FIG. 5 is a digital processor 550 configured to receive the measured voltages V1, V2 time-multiplexed at the output of ADC 540. The digital processor 550 may further process the measured voltages, e.g., to compute the resistance RL. In an exemplary embodiment, V1, V2 may be stored in a memory (not shown).

In an exemplary embodiment, the following operation may be performed to determine the resistance RL from V1, V2 (Equation 2):

$$RL = \frac{Rs}{\left(\frac{V_2}{V_1} - 1\right)}; \quad = \frac{Rs}{\left(\frac{V_2}{V_1} - 1\right)}.$$

In an exemplary embodiment, the computation indicated above may be performed by, e.g., the digital processor 550.

In the exemplary embodiment 500, a single amplifier 530 and ADC 540 may be utilized to perform the voltage measurements described. This advantageously avoids the need to match separate amplifiers and ADC's to each other, as would be the case in, e.g., the implementation 400 of FIG. 4. Furthermore, it will be appreciated that, as Rs will generally be chosen to have a relatively low value relative to RL, VAB and VAC will have commensurate values. This again stands in contrast to the implementation 400, wherein VAB is expected to be much larger than VBC, which complicates the matching of the signal paths, as earlier described hereinabove.

In FIG. 5, as VAB and VAC will generally have similar common-mode and differential voltage swings, the attenuation elements 520, 522 may be configured to provide roughly the same attenuation, which facilitates improved matching between the attenuation elements 520, 522. For example, in an exemplary embodiment, RL is 8 Ohms and Rs is 0.2 Ohms, in which case the ratio of VAB to VAC will be approximately 0.9756. Note these values are given for illustrative purposes only, and are not meant to limit the scope of the present disclosure.

Figure 6:
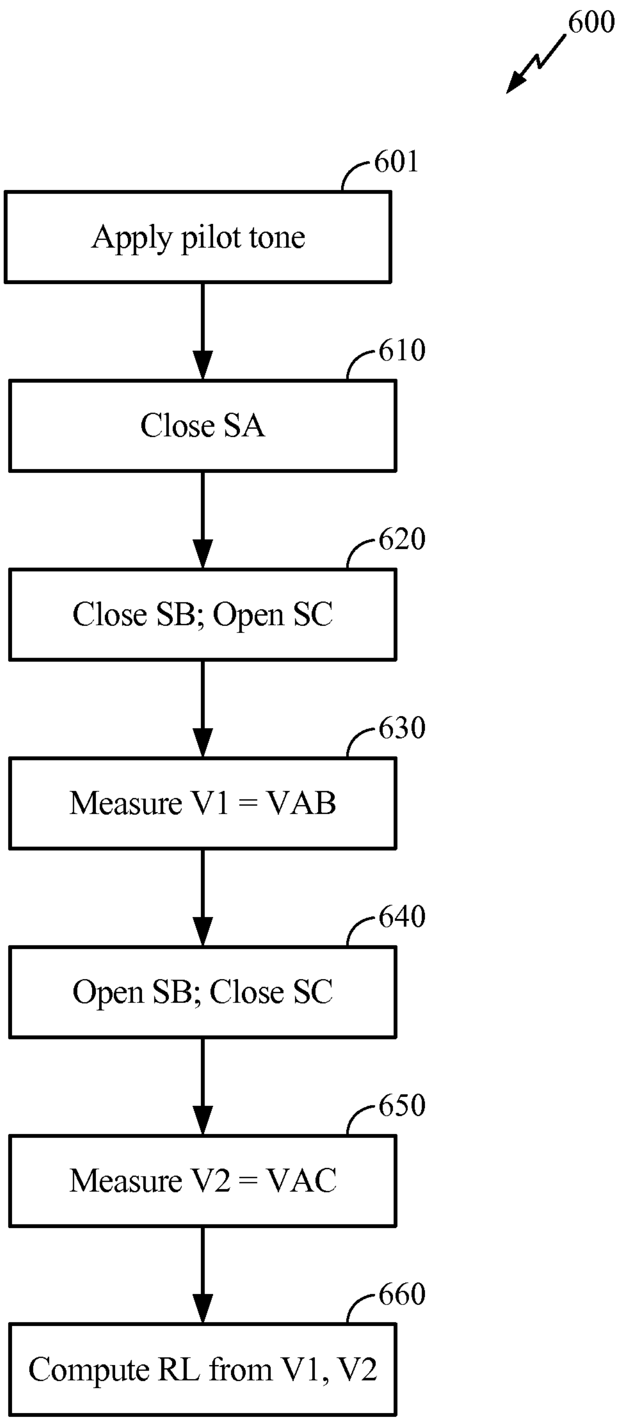
FIG. 6 illustrates an exemplary embodiment of a method according to the present disclosure.

FIG. 6 illustrates an exemplary embodiment of a method 600 according to the present disclosure. Note the method 600 is shown for illustrative purposes only, and is not meant to limit the scope of the present disclosure to any particular exemplary embodiment shown.

In FIG. 6, at block 601, a pilot signal or tone with a relatively low frequency (e.g., 40 Hz) may be applied at the input Vin of the amplifier 310. In an exemplary embodiment, the pilot tone may be independently applied during an initial calibration phase, and/or the pilot tone may be combined with a normal audio signal during a normal operation phase. As the frequency of the audio pilot tone is chosen to be lower than the audible frequency range, the presence of the pilot tone in Vin will not produce any audible artifacts.

It will be appreciated that the voltage sensing described herein may be a continuous operation, e.g., it may be performed not only during an initial calibration phase, but also during a normal audio operation phase. Note as the speaker impedance may vary with the audio signal, the technique described hereinabove of combining a pilot tone with the normal audio signal advantageously permits detecting the speaker impedance during normal operation to prevent overheating of the speaker. In an exemplary embodiment, an initial calibration phase may be provided to calibrate an initially measured speaker temperature with a known temperature.

In an exemplary embodiment, it will be appreciated that the magnitude of the pilot tone may be chosen taking into account, e.g., the amplifier gain and also the gain of elements shown in the exemplary embodiment 500. In alternative exemplary embodiments, the pilot tone need not be a sinusoid having a fixed frequency, and may instead correspond to other types of waveforms.

At block 610, the switch SA is closed to couple the output of LPF 410A to a first input of the differential amplifier 530.

At block 620, the switch SB is closed, while the switch SC is opened. In this manner, the output of LPF 410B is coupled to a second input of the differential amplifier 530.

At block 630, the output of ADC 540 is measured as a first voltage V1, while SB is closed. It will be appreciated that V1 in this case corresponds to VAB.

At block 640, SB is opened, while SC is closed. In this manner, the output of LPF 410C is coupled to the second input of the differential amplifier 530.

At block 650, the output of ADC 540 is measured as a second voltage V2, while SC is closed. It will be appreciated that V2 in this case corresponds to VAC.

At block 660, RL is computed from the measurements of V1 and V2 made at blocks 630 and 650. In an exemplary embodiment, such computation may be performed as according to Equation 2 described hereinabove.

Figure 7:
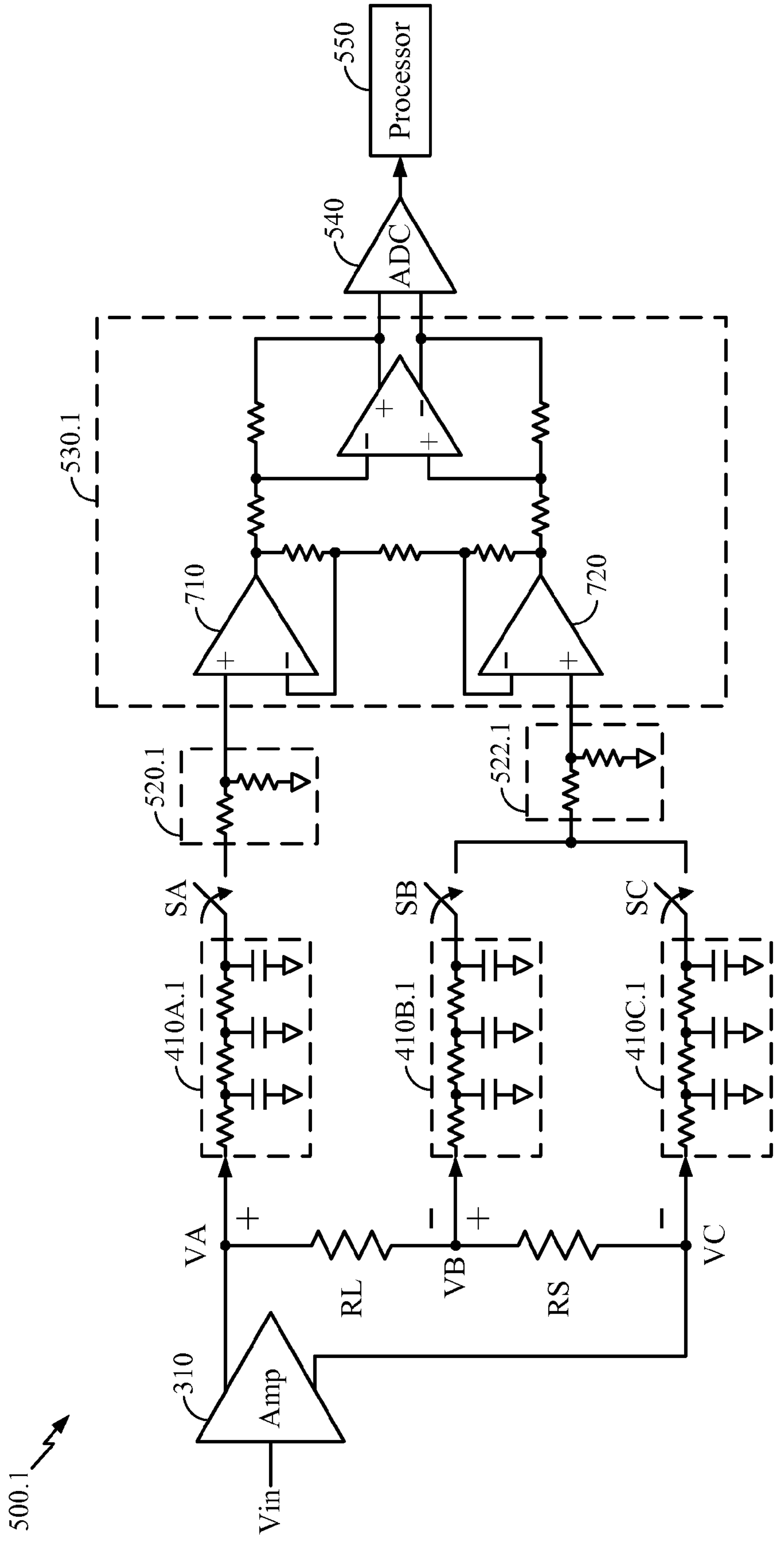
FIG. 7 illustrates an exemplary embodiment of the circuitry shown in FIG. 5.

FIG. 7 illustrates an exemplary embodiment 500.1 of the circuitry shown in FIG. 5. Note the exemplary embodiment 500.1 is shown for illustrative purposes only, and is not meant to limit the scope of the present disclosure to any particular implementations shown for the elements described. Note similarly labeled elements in FIGS. 5 and 7 may perform similar functionality, unless otherwise described.

In FIG. 7, each of the LPF's 410A.1, 410B.1, 410C.1 is implemented using the R-C networks shown, including resistors and capacitors (not explicitly labeled in FIG. 7). Furthermore, the attenuation elements 520.1 and 522.1 each include a series resistive divider for attenuating the outputs of the LPF's 410A.1, 410B.1, 410C.1, as coupled by the switches SA, SB, SC, respectively. The outputs of attenuators 520.1 and 522.1 are coupled to a differential amplifier 530.1 implemented according to principles known in the art. In particular, operational amplifiers (op amps) 710, 720 receive the inputs from attenuators 520.1, 522.1, and the op amps 710, 720 are configured using feedback principles to generate an amplified version of the differential input signal according to principles known in the art.

Figure 8:
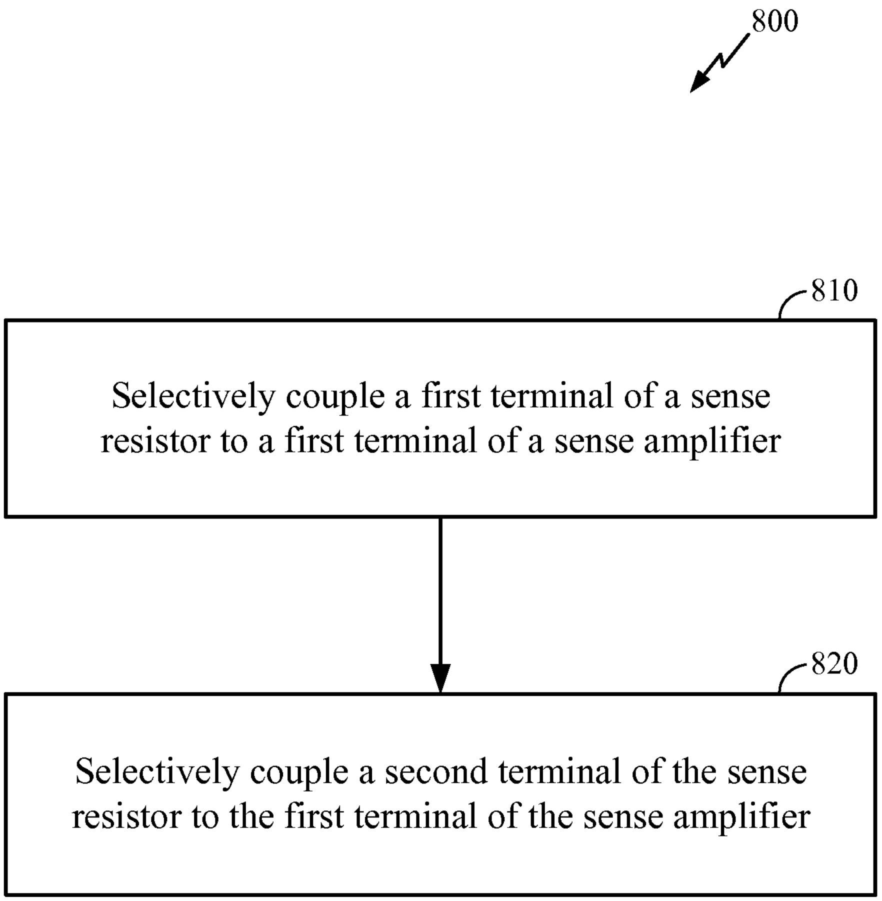
FIG. 8 illustrates an alternative exemplary embodiment of a method according to the present disclosure.

FIG. 8 illustrates an alternative exemplary embodiment of a method 800 according to the present disclosure.

At block 810, a first terminal of a sense resistor is selectively coupled to a first terminal of a sense amplifier.

At block 820, a second terminal of the sense resistor is selectively to the first terminal of the sense amplifier. In an exemplary embodiment, the first and second switches are configured to alternately couple one of the first and second terminals to a sense amplifier.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance, or an electrical short circuit, is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
- a sense resistor having a first terminal and a second terminal;
- a first switch coupled to the first terminal;
- a second switch coupled to the second terminal;
- wherein the first and second switches are configured to alternately couple one of the first and second terminals to a sense amplifier.

2. The apparatus of claim 1, further comprising:
- a load having a first terminal and a second terminal, the second terminal of the load coupled to the first terminal of the sense resistor; and
- a third switch configured to couple the first terminal of the load to the sense amplifier.

3. The apparatus of claim 2, further comprising:
- a first low-pass filter coupling the first terminal of the sense resistor to the first switch;
- a second low-pass filter coupling the second terminal of the sense resistor to the second switch; and
- a third low-pass filter coupling the first terminal of the load to the third switch.

4. The apparatus of claim 2, further comprising:
- a first attenuation element coupling the first and second switches to the first terminal of the sense amplifier; and
- a second attenuation element coupling the third switch to the second terminal of the sense amplifier.

5. The apparatus of claim 2, further comprising an analog-to-digital converter (ADC) coupled to an output of the sense amplifier.

6. The apparatus of claim 5, further comprising a processor configured to digitally compute a resistance of the load based on the output of the ADC.

7. The apparatus of claim 6, the processor configured to:
- store a first output of the ADC corresponding to when the first terminal of the sense resistor is coupled to the sense amplifier;
- store a second output of the ADC corresponding to when the second terminal of the sense resistor is coupled to the sense amplifier; and
- compute the resistance of the load by dividing a stored resistance of the sense resistor by a difference between a ratio of the second ADC output versus the first ADC output and 1.

8. The apparatus of claim 2, a size of the third switch being equal to a size of the first switch and a size of the second switch.

9. The apparatus of claim 2, further comprising:
- an amplifier configured to drive the load and the sense resistor, wherein the amplifier amplifies a pilot signal plus an audio input signal during a normal operation phase.

10. The apparatus of claim 9, wherein the pilot signal is a low-frequency alternating current (AC) voltage.

11. An apparatus comprising:
- means for selectively coupling a first terminal of a sense resistor to a sense amplifier; and
- means for selectively coupling a second terminal of the sense resistor to the sense amplifier;
- wherein the means are configured to alternately couple one of the first and second terminals to the sense amplifier.

12. The apparatus of claim 11, further comprising:
means for coupling a first terminal of a load having a first terminal and a second terminal to a second terminal of the sense amplifier, the second terminal of the load being coupled to the first terminal of the sense resistor.

13. The apparatus of claim 12, further comprising means for digitizing an output of the sense amplifier.

14. The apparatus of claim 13, further comprising means for digitally computing a resistance of the load based on the digitized output of the sense amplifier.

15. The apparatus of claim 14, further comprising means for driving the load with an audio voltage and a pilot signal.

16. A method comprising:
selectively coupling a first terminal of a sense resistor to a first terminal of a sense amplifier; and
selectively coupling a second terminal of the sense resistor to the first terminal of the sense amplifier;
wherein the selectively coupling the first and second terminals comprise alternately coupling one of the first and second terminals to the sense amplifier.

17. The method of claim 16, further comprising:
coupling a first terminal of a load having a first terminal and a second terminal to a second terminal of the sense amplifier, the second terminal of the load being coupled to the first terminal of the sense resistor.

18. The method of claim 17, further comprising digitizing an output of the sense amplifier.

19. The method of claim 18, further comprising digitally computing a resistance of the load based on the digitized output of the sense amplifier.

20. The method of claim 19, further comprising driving the load with an audio voltage plus a pilot signal.

* * * * *